(12) United States Patent
Sun et al.

(10) Patent No.: US 9,818,848 B2
(45) Date of Patent: Nov. 14, 2017

(54) THREE-DIMENSIONAL FERROELECTRIC FET-BASED STRUCTURES

(71) Applicant: Yale University, New Haven, CT (US)

(72) Inventors: Xiao Sun, New Haven, CT (US); Tso-Ping Ma, Branford, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/140,194

(22) Filed: Apr. 27, 2016

(65) Prior Publication Data

US 2016/0322368 A1 Nov. 3, 2016

Related U.S. Application Data

(60) Provisional application No. 62/154,325, filed on Apr. 29, 2015.

(51) Int. Cl.
| | |
|---|---|
| *H01L 29/78* | (2006.01) |
| *H01L 27/11* | (2006.01) |
| *H01L 29/66* | (2006.01) |
| *G11C 11/22* | (2006.01) |
| *H01L 27/1159* | (2017.01) |
| *H01L 27/11597* | (2017.01) |

(52) U.S. Cl.
CPC ........ *H01L 29/6684* (2013.01); *G11C 11/223* (2013.01); *H01L 27/1159* (2013.01); *H01L 27/11597* (2013.01); *H01L 29/78391* (2014.09)

(58) Field of Classification Search
CPC ..... H01L 29/66; H01L 29/6684; H01L 29/78; H01L 29/783; H01L 29/78391; H01L 28/55; H01L 27/11; H01L 27/115; H01L 27/11502; H01L 27/11507
USPC ........................................................ 257/295
See application file for complete search history.

(56) References Cited

U.S. PATENT DOCUMENTS

2016/0141299 A1* 5/2016 Hong ................ H01L 27/11578
257/324

OTHER PUBLICATIONS

M. H. White et al., On the go with SONOS, IEEE Circuit Devices Mag., vol. 16, No. 4, pp. 22-31, Jul. 2000.
R. M. Y. Ng et al., Vertically Stacked Silicon Nanowire Transitors Fabricated by Inductive Plasma Etching and Stress-Limited Oxidation, IEEE Electron Device Lett., vol. 30, No. 5, pp. 520-522, May 2009 Related Applications.
U.S. Appl. No. 62/154,325, filed Apr. 29, 2015.

* cited by examiner

*Primary Examiner* — Monica D Harrison
(74) *Attorney, Agent, or Firm* — McCarter & English, LLP

(57) ABSTRACT

Exemplary embodiments of the present disclosure are directed to three-dimensional (3D) Ferroelectric-gated FET (FeFET) structures that can be used to implement circuitry include memory cells, memory arrays, and/or other logic-based circuitry. For example, in exemplary embodiments, 3D FeFET AND memory arrays with vertical and horizontal channel structures are provided.

24 Claims, 11 Drawing Sheets

THREE-DIMENSIONAL FERROELECTRIC FET-BASED STRUCTURES

CROSS-REFERENCE TO RELATED APPLICATION

The present application claims priority benefit to a provisional application entitled "Three-Dimensional Ferroelectric FET-Based Structures," which was filed on Apr. 29, 2015, and designated by Ser. No. 62/154,325. The entire content of the foregoing provisional patent application is incorporated herein by reference.

TECHNICAL FIELD

Exemplary embodiments of the present disclosure relate to three-dimensional Ferroelectric-gated Field Effect Transistor (FeFET) structures, and to the fabrication and operation of three-dimensional Ferroelectric-gated Field Effect Transistor (FeFET) structures for memory arrays and/or other logic circuits.

BACKGROUND

Random access memory (RAM) falls generally into two categories, namely, static and dynamic. Both types of RAM are made up of an array of addressable storage cells, each one storing a bit of information (or multi-bit information). In static RAM (SRAM), the storage unit within the cell is typically a bi-stable flip-flop and the state of the flip-flop indicates whether the cell stores a zero or a one. In dynamic RAM (DRAM) the storage unit is typically an integrated circuit (IC) capacitor and the charge on the capacitor indicates whether the stored value is either a zero or a one. In the case of DRAM's, however, capacitors gradually lose charge and thus it is necessary to "refresh" the stored data as often as every few milliseconds. The refreshing operation is performed by first reading the value in the cell and then writing it back. This is done for every cell in the array and it typically requires complicated control circuitry. Storage-Class memory has lower read/write speed than DRAM, but a much longer retention time, and therefore it can keep data even without power supply. A common storage-class memory is flash memory based on floating gate transistor and/or charge-trap transistor.

Due to its fast switching speed and long retention, FeFET (Ferroelectric-gated Field-Effect Transistor) can perform the function of DRAM and/or one or more Flash memory cells. FeFET-based DRAM (FeDRAM) has several advantages over the conventional DRAM including, for example, that FeDRAM: (1) is made of a capacitor-less single-transistor structure, which is more compact, easier to fabricate, and more scalable; (2) has much longer retention that enables low refresh frequencies, and therefore much lower power consumption; and (3) has non-destructive read-out schemes, and therefore does not require a write operation to recover data after every read operation. The recent discovery of HfO$_2$-based ferroelectric film has overcome some limitations of FeFET that use conventional ferroelectric materials, making FeDRAM much more viable. In addition, FeFET based flash memory cells are also possible with HfO$_2$-based ferroelectric, which has much faster switching speed and better endurance than conventional floating gate and charge-trap based flash.

Three-dimensional (3D) structures can potentially increase the memory density, shorten connection paths, and reduce the cost per memory bit for DRAM and Storage-Class Memory. Recently, there has been some developments with 3D NAND structures, which are specifically designed for high density storage application without random access capability. For random access memory capability, 3D memory arrays with NOR connections have been reported.

SUMMARY

Exemplary embodiments of the present disclosure are directed to three-dimensional Ferroelectric-gated FET (FeFET) structures that can be used to implement memory cells, arrays, and/or other logic-based circuitry.

In accordance with embodiments of the present disclosure, a three-dimensional Ferroelectric Field Effect Transistor (FeFET)-based memory array is disclosed. The memory array includes a semiconductor substrate, an array of channel structures, an array of gate electrode structures, and an array of source/drain electrode structures. The array of channel structures has a ferroelectric material disposed along the channel structures. The array of gate electrode structures are operatively coupled to the channel structures at discrete regions along a length of the channel structures. The array of source/drain electrode structures are operatively coupled to the channel structures at discrete regions along a length of the channel structures. The channel structures, the gate electrode structures, and the source/drain electrodes structures are substantially perpendicularly disposed with respect to each other on the semiconductor substrate. An array of FeFETs memory cells are formed on each of the channel structures based on the discrete regions of the channel structure at which the gate electrode structures and the source/drain electrode structures are operatively coupled.

In accordance with embodiments of the present disclosure, a Ferroelectric Field Effect Transistor (FeFET)-based memory circuit is disclosed. The memory circuit includes a plurality of FeFET-based data memory cells with logical AND connections. The FeFET-based data memory cells are arranged in a three-dimensional structure that includes: an array of channel structures having a ferroelectric material disposed along the channel structures; an array of gate electrode structures operatively coupled to the channel structures at discrete regions along a length of the channel structures; and an array of source/drain electrode structures operatively coupled to the channels structures at discrete regions along a length of the channel structures. The channel structures, the gate electrode structures, and the source/drain electrodes structures are substantially perpendicularly disposed with respect to each other on a semiconductor substrate. The plurality of FeFETs memory cells are formed by each of the channel structures based on the discrete regions of the channel structure at which the gate electrode structures and the source/drain electrode structures are operatively coupled.

In accordance with embodiments of the present disclosure, a method of fabricating a three-dimensional Ferroelectric Field Effect Transistor (FeFET)-based memory array is disclosed. The method comprising forming an array of hardmask on a semiconductor wafer; etching isotropically one line of the hardmask to form etched walls; covering sides of the etched walls with a mask; repeating steps b and c to obtaining a multi-layer structure; and further etching or oxidizing the multi-layer structure to separate channels in a direction that is substantially perpendicular to the semiconductor wafer to form a plurality of channel structures.

In accordance with embodiments of the present disclosure, a method of fabricating a three-dimensional Ferroelectric Field Effect Transistor (FeFET)-based memory array is disclosed. The method includes depositing channel material on a semiconductor wafer; depositing isolation material on the channel material; repeating steps a and b to form a multilayer structure having alternating layers of the channel material and the isolation material; and forming a hardmask on the multilayer structure to cover portions of the multilayer structure; and removing strips of the multilayer structure to define separate channel structures that extend horizontally with respect to the semiconductor wafer.

Any combination and permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

Exemplary embodiments of the present disclosure will be understood from the following detailed description when read with the accompanying Figures. In the drawings, like reference numerals refer to like parts throughout the various views of the non-limiting and non-exhaustive embodiments of the present invention, and wherein.

DETAILED DESCRIPTION

Exemplary embodiments of the present disclosure are directed to three-dimensional (3D) Ferroelectric-gated FET (FeFET) structures that can be used to implement circuitry include memory cells, memory arrays, and/or other logic-based circuitry. For example, in exemplary embodiments, 3D FeFET AND memory arrays are described, which leads to improvements over conventional technology. Exemplary embodiments of the present disclosure can also be implemented to realize 3D memory arrays with logical NOR configurations that can result in higher storage densities than conventional memory technology. The FeFET-based 3D memory array with logical AND connections can be used as DRAM, Flash, and multi-purpose memory, with random access capability, and thus short access time. Compared to existing FeFET's state-of-the-art, exemplary embodiments of the present disclosure have many advantages due to the 3D structure. For example, embodiments of the 3D structures described herein can have high densities and a low cost-per-bit as compared to conventional memory technology.

Figure 1:
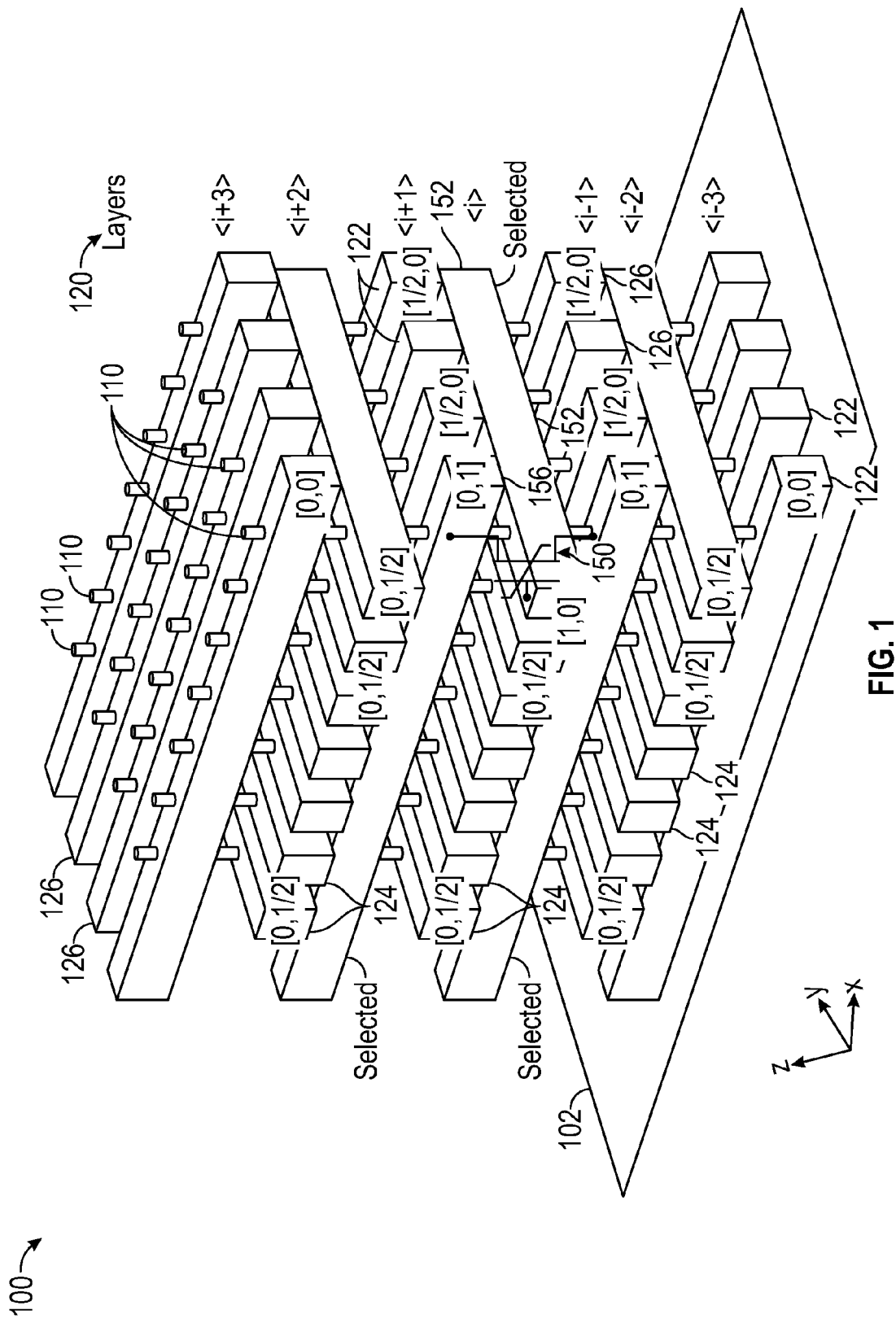
FIG. 1 a schematic view of an exemplary three-dimensional memory structure fabricated using Ferroelectric-gated Field Effect Transistors having vertical channels in accordance with embodiments the present disclosure.

FIG. 1 shows an illustration of a three-dimensional (3D) stacked structure 100 forming a FeFET memory array with "AND" logic connections. Isolation material between layers, Ferroelectric film, and interfacial layers of the 3D structure has been omitted from FIG. 1 to show the gate, source and drain electrode structures of the FeFET memory array. The 3D stacked structure 100 can be formed on a substrate 102, such as silicon, and the geometry of the structure 100 can be described with respect to the substrate 102. In FIG. 1, the z-axis represents a vertical direction (e.g., perpendicular to the substrate) and the x and y axes represent horizontal directions (e.g., parallel to the substrate).

As shown in FIG. 1, the 3D structure 100 includes an array of vertically formed channel structures 110 (e.g., pillars, rods, or other suitable geometries of channel material) having a length that extend vertically and substantially perpendicularly (e.g., perpendicularly or approximately perpendicularly) from the substrate 102 along the z-axis. The channel structures 110 can form an array of columns, where each column can have a corresponding x-axis coordinate and a y-axis coordinate. The vertical channel structures 110 can be any semiconductor that can serve as the channel of an array of FeFETs. For example, the channel structure can be made of silicon, poly-silicon, amorphous silicon, germanium, III-V material, organic semiconductors, and the like.

Layers 120 include horizontally formed source/drain electrode structures 122, gate electrode structures 124, and source/drain electrode structures 126 (e.g., rectangular bars or other suitable geometries of source, gate, or drain material) that have lengths that extend horizontally (e.g., along the x and/or y axes), and in planes that are substantially parallel, to the substrate 102 where structures in adjacent layers have a substantially perpendicular relationship to each other. The gate electrode structures 124 can be arranged in an array rows, where each row can have a corresponding x-axis coordinate and z-axis coordinate. The source/drain electrode structures 122 and 126 can be arranged in an array rows, where each row can have a corresponding y-axis coordinate and z-axis coordinate. The gate electrode structures 124 of the transistors can formed with a ferroelectric material, including, for example, an HfO$_2$-based ferroelectric or any other suitable ferroelectric material. The vertical channel structures can be doped to form source or drain regions in the portions of the vertical channel structures 110 that contact or interest the source/drain electrode structures 122 and 126.

The gate electrode structures of each FeFET can be formed horizontally in one or more planes defined by the x and y axes, and the source/drain electrode structures of each FeFET can be formed horizontally in one or more planes defined by the x and y-axes. As one example, a layer <i−1>, which refers to a specified position along the z-axis, can be formed with a row of the source/drain electrode structures 122 such that the lengths of the source/drain electrode structures 122 extend along the x-axis. The source/drain electrode structures 122 in the layer <i−1> can generally be arranged to be co-planar to each other in an x-y plane associated with the layer <i−1>. The source/drain electrode structures 122 can further be generally arranged such that the lengths of the source/drain electrode structures 122 are substantially parallel to each other, substantially parallel to the substrate 102, and substantially perpendicular to the vertically formed channel structures 110.

As another example, a layer <i>, which refers to a specified position along the z-axis above the layer <i−1>, can be formed with a row of the gate electrode structures 124 such that the length of the gate electrode structures 124 extend along the y-axis. The gate electrode structures 124 in the layer <i> can generally be arranged to be co-planar to each other in an x-y plane associated with the layer <i>, and can be generally arranged such that the lengths of the gate electrode structures 124 are parallel to each other, parallel to the substrate 102, substantially perpendicular to the source/drain electrode structures 122, and substantially perpendicular to the vertically formed channel structures 110.

As another example, a layer <i+1>, which refers to a specified position along the z-axis above the layer <i>, can be formed with a row of the source/drain electrode structures 126 such that the length of the source/drain electrode structures 126 extend along the x-axis. The source/drain electrode structures 126 in the layer <i+1> can generally be arranged to be co-planar to each other in an x-y plane associated with the layer <i+1>, and can be generally arranged such that the lengths of the source/drain electrode structures 126 are parallel to each other, parallel to the substrate 102, parallel to the source/drain electrode structures 122, substantially perpendicular to the gate electrode structures 124, and substantially perpendicular to the vertically formed channel structures 110. As shown in FIG. 1, the layers 120 can generally alternate between a layer with structures having lengths extending along the x-axis and layers having structures extending along the y-axis (e.g., at an offset of about ninety degrees about the z-axis).

In exemplary embodiments, each of the structures 122, 124, and 126 can intersect or otherwise be in contact with one or more of the channel structures 110 in the 3D structure 100, and each of the structures can be referred to as select lines (e.g., a gate select line, a source/drain select line). As one example, each of the gate electrode structures 124 can form an array of gates along the y-axis, where each of the gate electrode structures 124 contacts or intersects with a corresponding array of the channel structures 110. Likewise, as another example, each of the source/drain electrode structures 122 and 126 can form an array of source lines or drain lines along the y-axis, where each of the source/drain electrode structures 122 and 126 contacts or intersect with a corresponding array of channel structures 110, which can be doped at the region of contact or intersect to form sources and/or drains of FeFETs in the array. In some embodiments, each of the structures 122, 124, and 126 can be formed to surround a corresponding array of channel structures 110 in their respective levels such that the channel material can be pass vertically through the structures 122, 124, and 126. For example, in exemplary embodiments, the gates of each FeFET defined by the gate electrode structures 124 can be formed to surround the vertical channel structures 110, resulting in gate-all-around (GAA) transistor structures.

One of the FeFETs formed by the 3D structure 100 is shown having a FET symbol 150 superimposed on the structure to illustrate the formation of a particular FeFET memory cell within a three-dimension FeFET memory array of the 3D structure 100. In the present example shown in FIG. 1, the FeFET memory cells with logic AND connections, which can require that each electrode structure corresponding to a FeFET memory cell be selected. For example, to access (e.g., read, and write including program or erase) FeFET memory cell corresponding to the FET symbol 150, a corresponding gate selection line in level <i> (denoted as gate electrode structure 152) is selected and the corresponding source/drain lines in levels <i−1> and <i+1> (denoted as source/drain electrode structures 154 and 156, respectively,) are selected the gate electrode structure, and two source/drain structures corresponding to the particular memory cell. In some embodiments, the gate selection lines of the three-dimension FeFET memory array can correspond to word lines and the source/drain selection lines can correspond to bit lines and/or source lines of the three-dimension FeFET memory array. In some embodiments, in addition to data storage provided by the memory cells 120 of an array 110, some, all, or none of the FeFET memory cells can be utilized for purposes other than data storage. For example, in exemplary embodiments, one or more of the FeFET memory cells can used as parity storage areas for ECC, storage areas for counters, reference FeFET memory cells, and/or can include storage for any other suitable purpose, such as for hashing and the like.

To realize "NOR"-type connections in the 3D structure 100 of FIG. 1, the source structures 122 can be all electrically grounded. Therefore, it is not necessary to define separated source lines in the x-y plane for "NOR"-type connections. While the structures 122 and 126 may be described as being source structures or drain structures, respectively, in exemplary embodiments, the structures 122 and 126 may form either the source structures or the drain structures.

Figure 2:
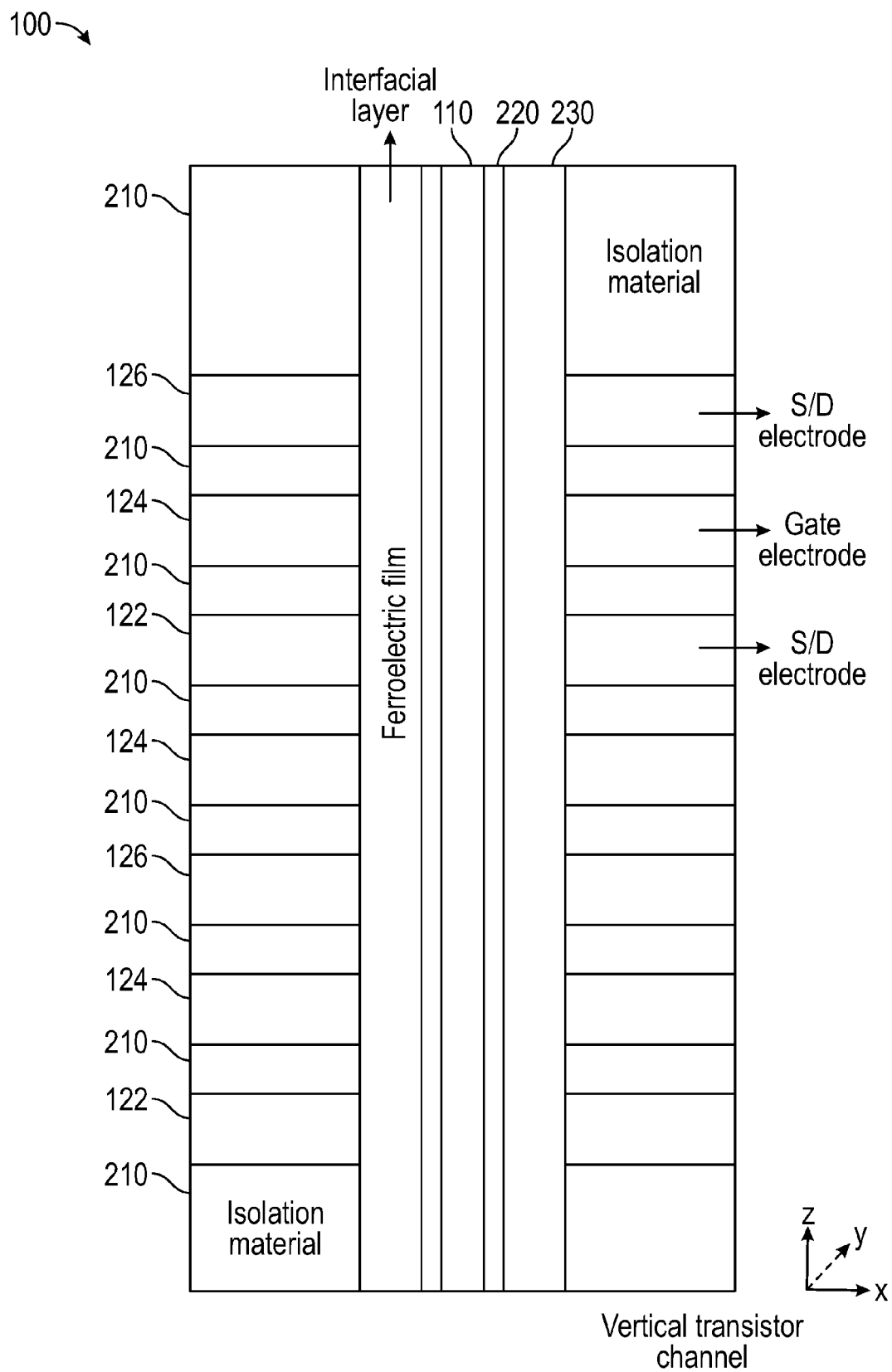
FIG. 2 is a schematic view showing a cross sectional view of the exemplary three-dimensional memory structure of FIG. 1 in accordance with embodiments the present disclosure.

FIG. 2 is the cross sectional view of the 3D structure 100 of FIG. 1 along the z-axis through one of the vertically formed channel structures 110. As shown in FIG. 2, adjacent layers of horizontally formed structures can be separated by an isolation material 210, such as, for example, silicon dioxides, silicon nitrides, air gap, and the like electrically insulating material. The channel structure 110 can be surrounded by an interfacial layer 220, such as, for example, silicon oxides, silicon nitrides, or other types of dielectrics. A ferroelectric material 230 can be disposed to surround the interfacial layer 220 such that the interfacial layer 220 is disposed between the ferroelectric material 230 and the channel structure 110. This configuration can advantageously reduce gate leakage and improve the interface quality of the FeFETs formed in this manner. For the storage-class memory application, the ferroelectric gate stack in FIGS. 1 and 2 can be replaced by charge-trapping gate stacks, such as the Oxide-Nitride-Oxide stack in the SONOS memory described in "On the go with SONOS," *IEEE Circuit Devices Mag.*, vol. 16, no. 4, pp. 22-31, July 2000 by M. H. White et al., the entirety of which is incorporated by reference herein.

Figure 3:
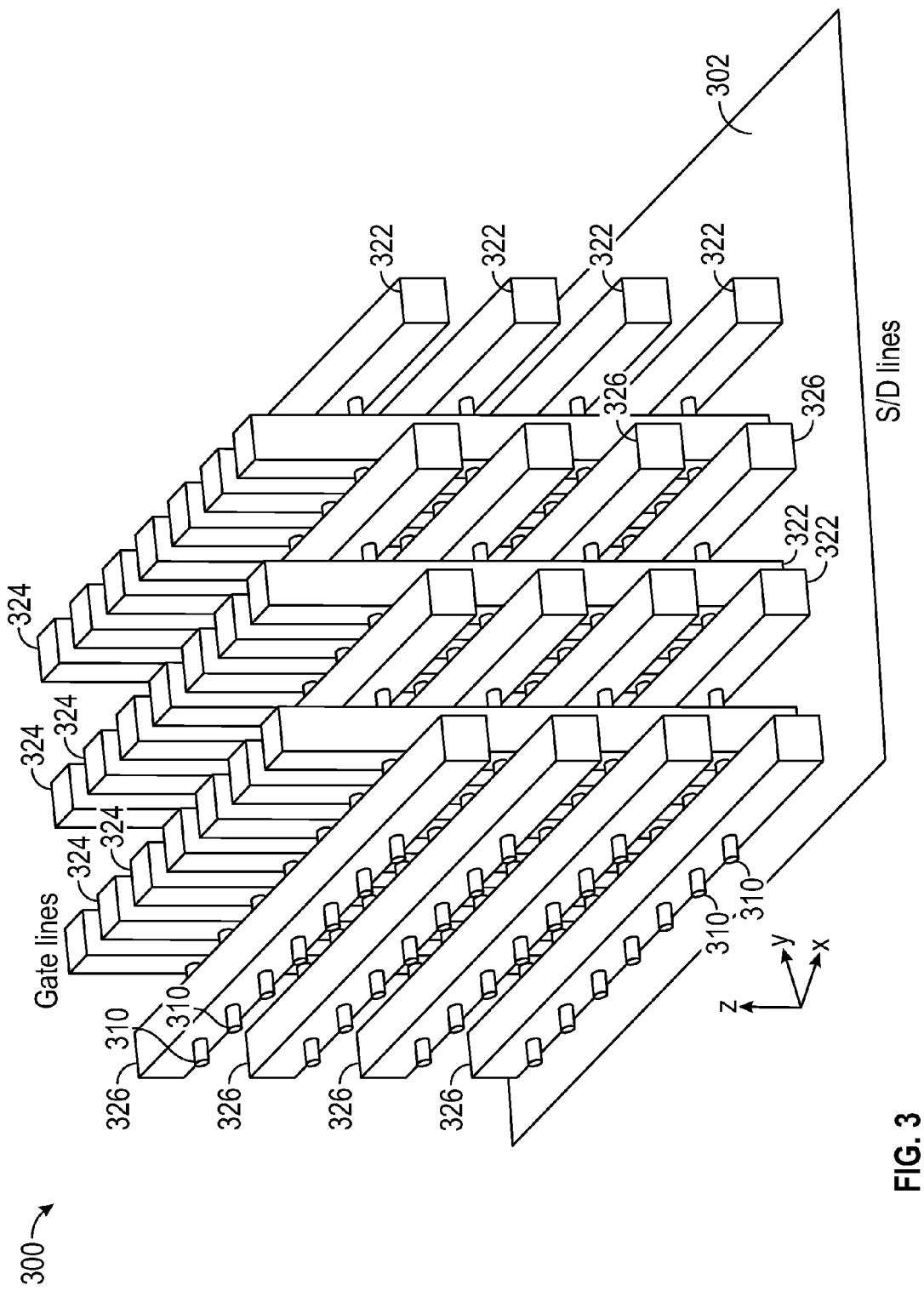
FIG. 3 is a schematic view of an exemplary three-dimensional memory structure fabricated using Ferroelectric-gated Field Effect Transistors having horizontal channels in accordance with embodiments the present disclosure.
Figure 4A:
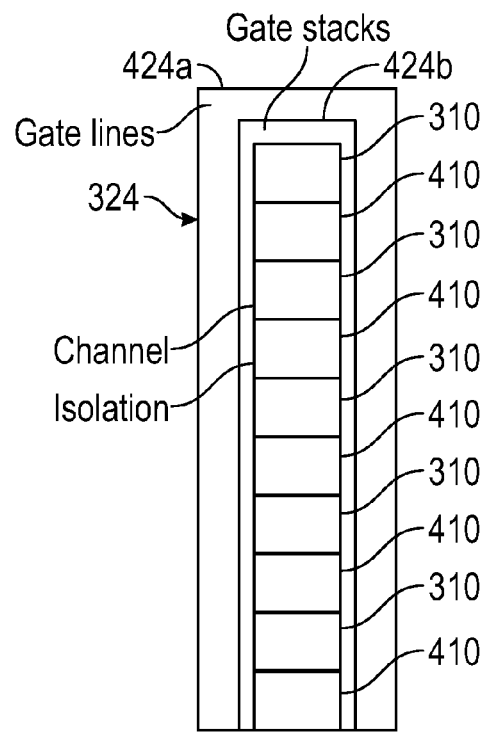
FIGS. 4A-B showing a cross sectional view of the exemplary three-dimensional memory structure of FIG. 3 in accordance with embodiments the present disclosure.
Figure 4B:
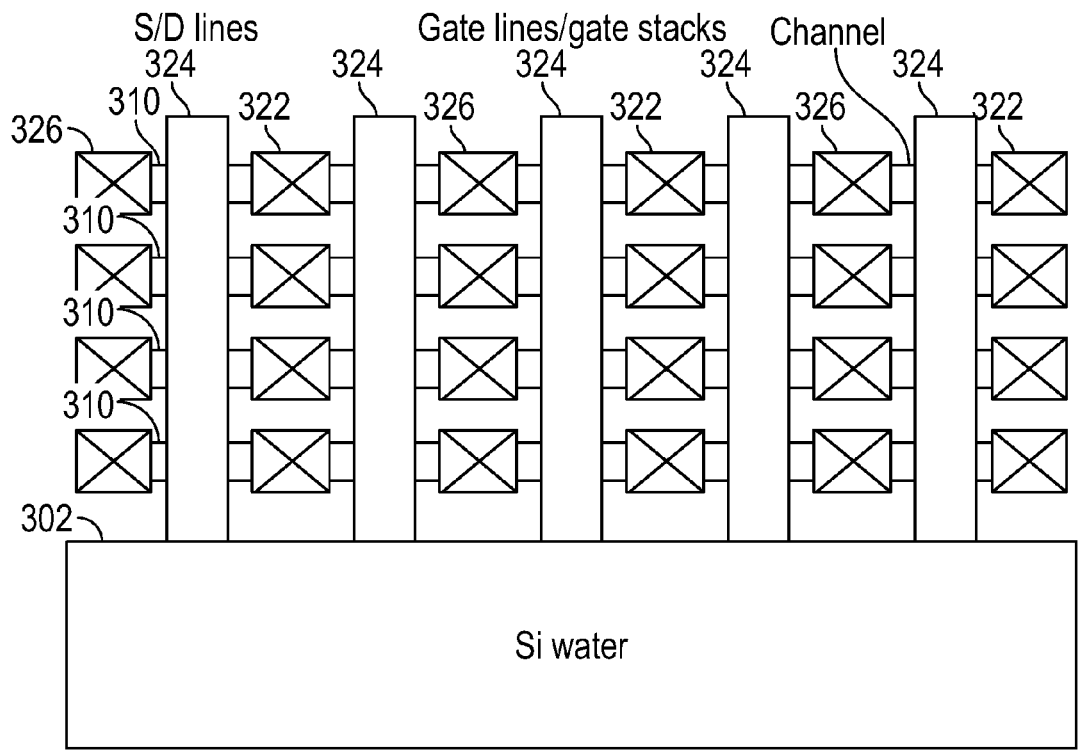

An alternative structures can obtained by flipping the whole structure shown in FIG. 1 by 90°, as shown in FIG. 3, so that there is no crossing electrode lines as seen along the z direction. As such, the channel, the gate line, and the S/D lines can be defined using top-down lithography, etching, and deposition processes. FIG. 3 is a schematic view of an exemplary 3D memory structure 300 fabricated using Ferroelectric-gated Field Effect Transistors having horizontally channel structures 310 with respect to a substrate 302 upon which the 3D memory structure 300 is formed in accordance with embodiments the present disclosure. FIGS. 4A-B show cross sectional views of the exemplary three-dimensional memory structure 300 of FIG. 3 in accordance with embodiments the present disclosure. FIG. 4A is a cross sectional view perpendicular to the channel direction (the y direction), after the formation of gate contact portions, and FIG. 4B is a cross sectional view parallel to the channel direction, after etching out the channel part to form vertical source/drain lines in FIG. 3. For example, the lengths of the channel structures 310 can extend along a y-axis generally parallel to the substrate 302. As shown in FIG. 4A an isolation material 410 can be disposed between channel structures 310. The lengths of source/drain electrodes 322 and 326, and gate electrode structures 324 can extend substantially perpendicularly to the channel structures 310 in the z-axis direction and/or x-axis direction. In the present embodiment, the lengths of the gate electrode structures 324 can extend along the z-axis and the lengths of the source/drain electrodes 322 and 326 can extend along the x-axis such that the adjacent layers of the source/drain electrodes 322 and 326 and the gate electrode structures 324 can be arranged substantially perpendicularly to each other. As shown in FIG. 4A the gate electrode structures 324 can include a gate electrode 424a and a gate material 424b.

For horizontal lines, such as the source/drain electrodes 322 and 326 in FIGS. 3 and 4B, the electrode material and an isolation material are alternatively deposited in the defined region layer-by-layer, then etched to form patterns in the x-y plain. Alternatively, separate source/drain regions can be exposed first, followed by filling of the source/drain electrode material and the isolation material. The channel portions in the source/drain region can be removed before this deposition, or are not deposited at the first place when forming the channels, to avoid blocking filling of the source/drain contacts and the isolation material. As such, the source/drain contacts in FIG. 3 are actually not wrapping around the channel structures 310 as the case in FIG. 1, but rather contacting at the interface between the channels and the source/drain electrodes, as shown in FIG. 4B.

Figure 5:
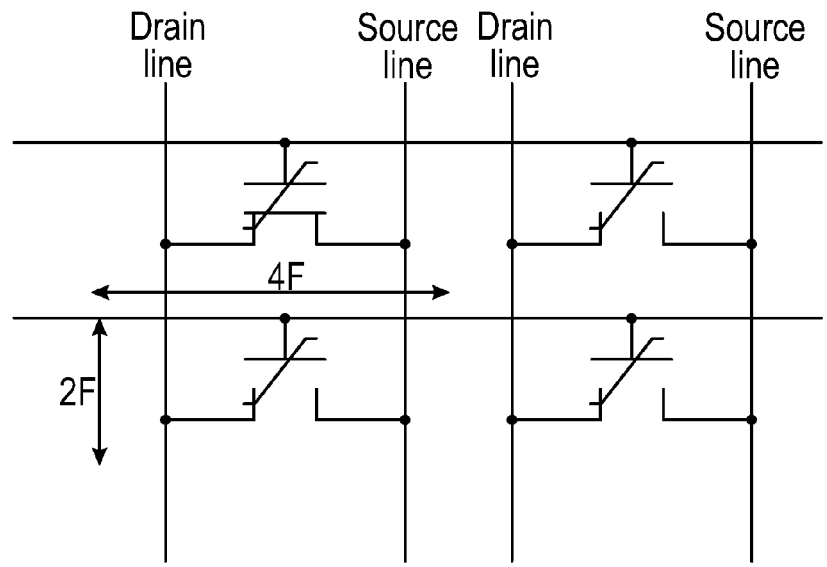
FIG. 5 is a schematic view of a layout of an exemplary 2D AND FeFET memory array
Figure 6:
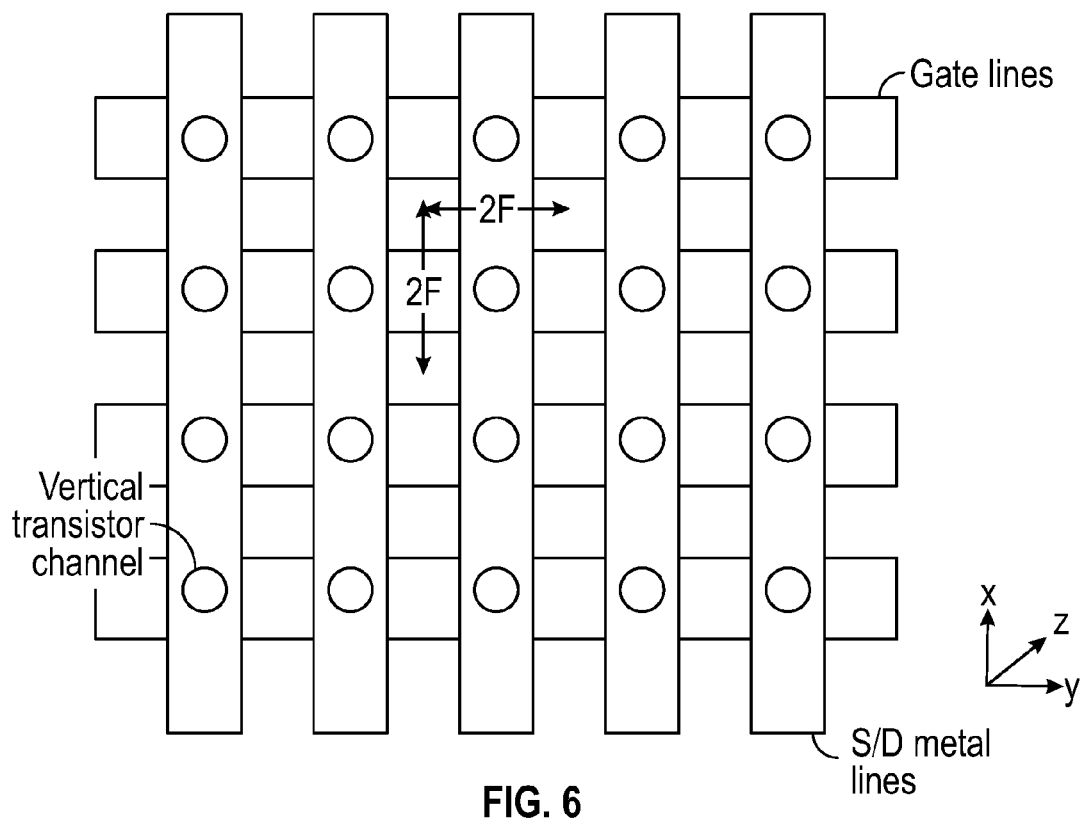
FIG. 6, is a schematic view of a layout of an exemplary 3D AND FeFET memory array in accordance with exemplary embodiments.

The area efficiency in the 3D AND FeFET memory structures shown in FIGS. 1-4 is improved compared to 2D AND FeFET memory structures. For example, as shown in FIG. 5, a 2D AND FeFET memory array is relatively area inefficient, because the neighboring memory cells are separated by the Source line for the left column of cells and the Drain line for the right column of cells, which consume at least 3F, where F is the minimum feature size of the semiconductor process. In the 3D AND structure shown in FIGS. 1-2, by introducing a third dimension and forming the structure 100, the source lines and drain lines are not adjacent to each other. Instead, all source and drain line planes are separated by word line planes. As shown in FIG. 6, the size of each cell in the x-y plane is $2F \times 2F = 4F^2$ for the 3D structure. In addition, in a 3D stack containing N layers, each cell has an effective area of $4F^2/(N/2)$, which advantageously provides for a more area efficient structure as compared to 2D AND FeFET memory structures, which normally have a cell size of $8F^2$ without a buried source line.

Figure 7:
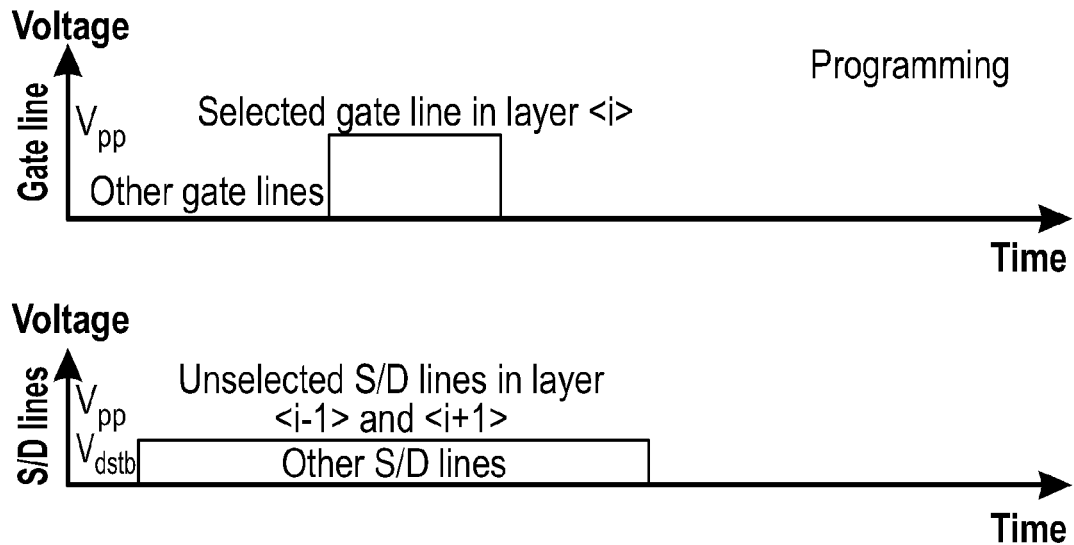
FIG. 7 show timing diagrams for programming and disturbance prevention voltages for a selected cell, peripheral unselected cells, and other unselected cells in accordance with embodiments the present disclosure.

FIG. 7 is a timing diagram that illustrates a programming sequence for the 3D FeFET-based memory arrays described herein. During programming, the gate line of the target FeFET is selected and a high voltage bias ($V_{pp}$) is applied on it, while the source/drain lines of the target FeFET are also selected and given a base/ground voltage, resulting in a large electric field across the ferroelectric gate stack of the selected FeFET to switch its polarization. All other lines are kept at base/ground voltages unless specified below to prevent disturbance to the unselected cells. Biasing schemes can be implemented to reduce or prevent disturbances to unselected cells during programming. For example, with reference to FIG. 1, during programming, the source/drain lines for all the peripheral transistors sharing the same gate line with the target transistors are connected to an intermediate voltage ($V_{dstb}$), causing the voltage drop from their gates to the channels to be $V_{pp} - V_{dstb}$. For example, if $V_{dstb} = \frac{1}{2} V_{pp}$, the net bias equals to $\frac{1}{2} V_{pp}$.

Figure 8:
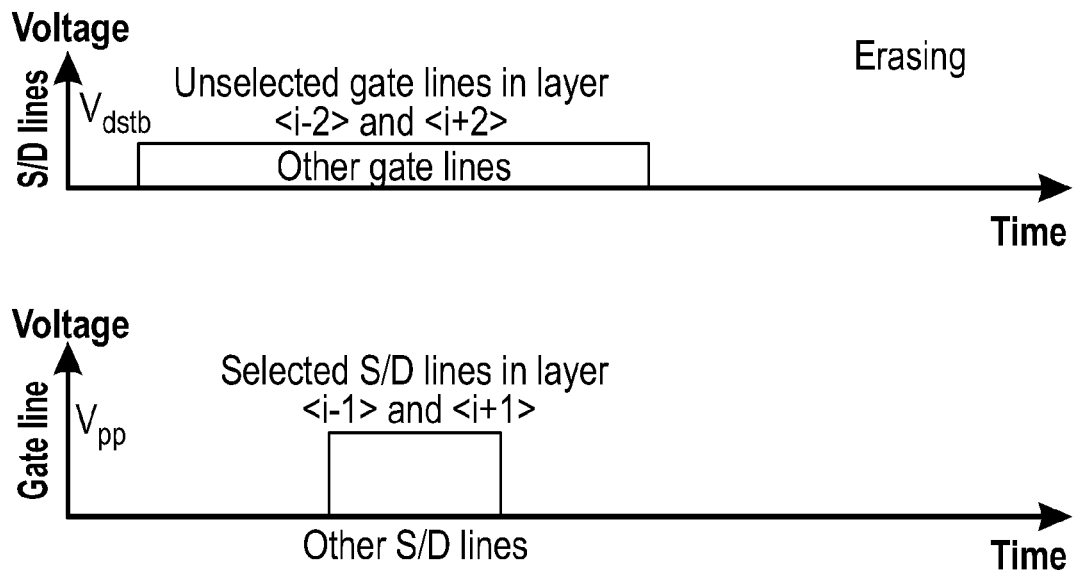
FIG. 8 shows timing diagrams for erasing and disturbance prevention voltages for a selected cell, peripheral unselected cells, and other unselected cells in accordance with embodiments the present disclosure.

FIG. 8 is a timing diagram that illustrates an erase sequence for the 3D FeFET-based memory arrays described herein. During erasing, the source/drain lines of the target FeFET are selected and a high voltage bias ($V_{pp}$) is applied on them, while the gate line of the target FeFET is selected and given a base/ground voltage, resulting in a large electric field across the ferroelectric gate stack of the selected FeFET to switch its polarization. All other lines are kept at the base/ground voltage unless specified below to prevent disturbance to the unselected cells. Biasing schemes can be implemented to reduce or prevent disturbances to unselected cells during an erase. For example, with reference to FIG. 1, during an erase, the gate lines for all the peripheral transistors sharing the same S/D lines with the target transistors are connected to an intermediate voltage ($V_{dstb}$), causing the voltage drop from their channels to the gates to be ($V_{pp} - V_{dstb}$).

With this bias scheme described above with reference to FIGS. 1, 7, and 8, three layers of unselected transistors (with their gates at the layers i−2, i, and i+2 in FIG. 1) (e.g., because the gate line of the selected cell's is in layer <i> in the present example) endure a mitigated disturbance voltage. The timing diagrams of FIGS. 7 and 8 show the voltages for programming, erasing, and disturbance prevention for the selected cell (in layer <i>), peripheral unselected cells (from layers <i−2> to <i+2>), and other unselected cells.

The 3D AND FeFET-based memory structure in FIG. 1 can be fabricated layer-by-layer using a bottom-up approach using repeated processing steps of lithography, etching, filling, and/or chemical-mechanical planarization (CMP). For example, the structure of FIG. 1 can be formed in a manner similar to the process for forming vertically stacked RRAM. Other fabrication methods can be exploited to simplify the process.

Figure 9A:
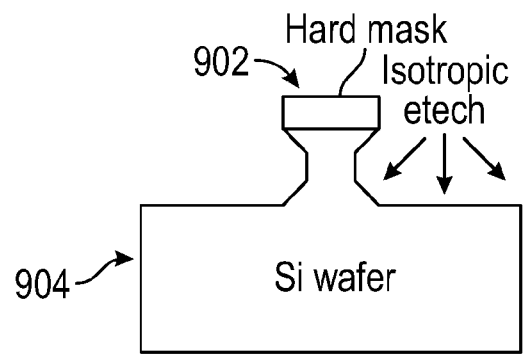
FIGS. 9A-G schematically illustrate a fabrication of horizontal silicon channels for an exemplary three-dimensional memory structure with Ferroelectric-gated Field Effect Transistors in accordance with embodiments the present disclosure.
Figure 9B:
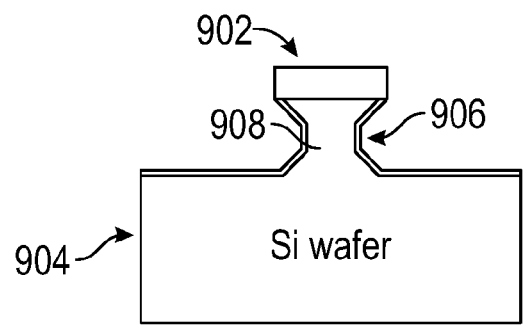
Figure 9C:
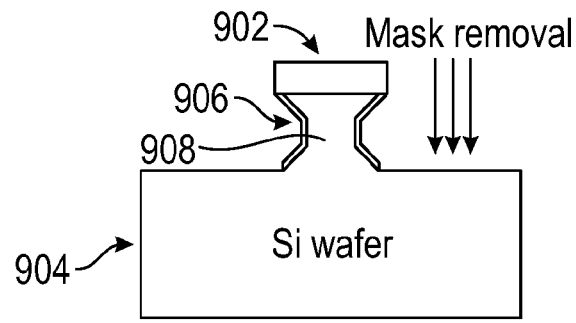
Figure 9D:
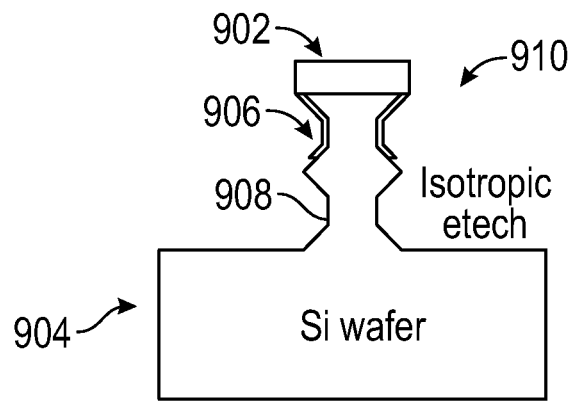
Figure 9E:
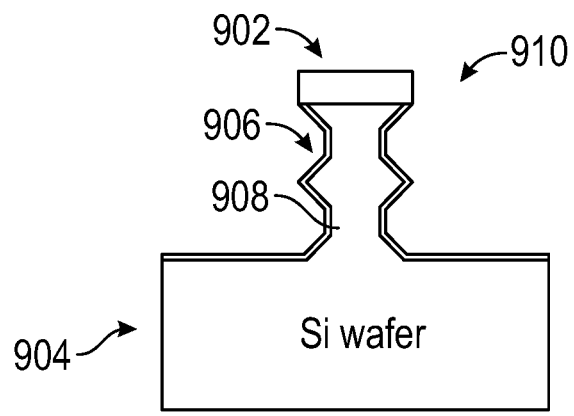
Figure 9F:
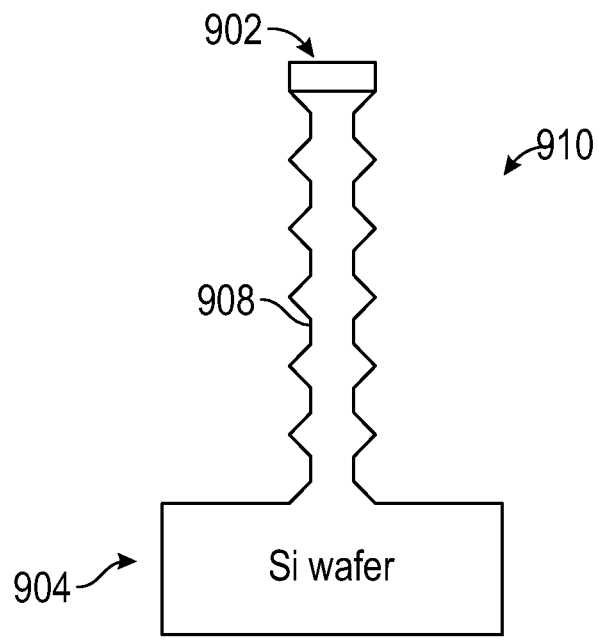
Figure 9G:
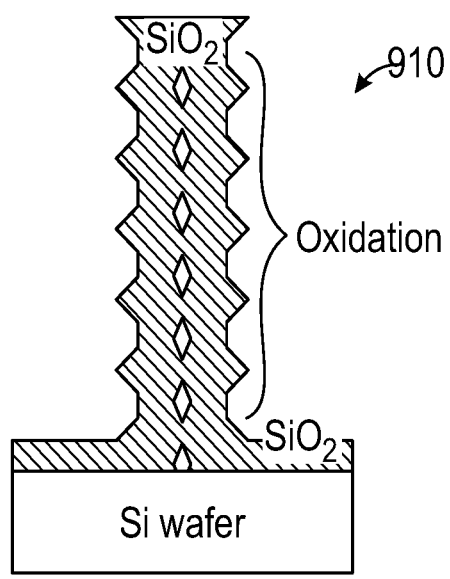

FIGS. 9A-G and 10A-B show some possible process steps to fabricate the 3D Horizontal AND structure shown in FIG. 3-4, which can follow a fabrication process described by R. M. Y. Ng et al., entitled "*Vertically Stacked Silicon Nanowire Transistors Fabricated by Inductive Plasma Etching and Stress-Limited Oxidation,*" in IEEE Electron Device Lett., vol. 30, no. 5, pp. 520-522, May 2009, the entirety of which is incorporated herein by reference. With reference to FIGS. 9A-G, a process of forming the channel structures can include: (1) forming an array of hardmask 902 on the semiconductor wafer 904; (2) etching isotropically (only one line of the hardmask 902 shown in FIG. 9A); (3) covering the sides of the etched walls 906 by a mask 908; (4) repeating (2) and (3) (FIGS. 9D-E) and obtaining a multilayer structure 910 as shown in FIG. 9F; and (5) further etching or oxidizing the structure 910 to separate the channels in the z direction as shown in FIG. 9G. One advantage of this method is that the channels can be formed out of wafers with high material quality.

Figure 10A:
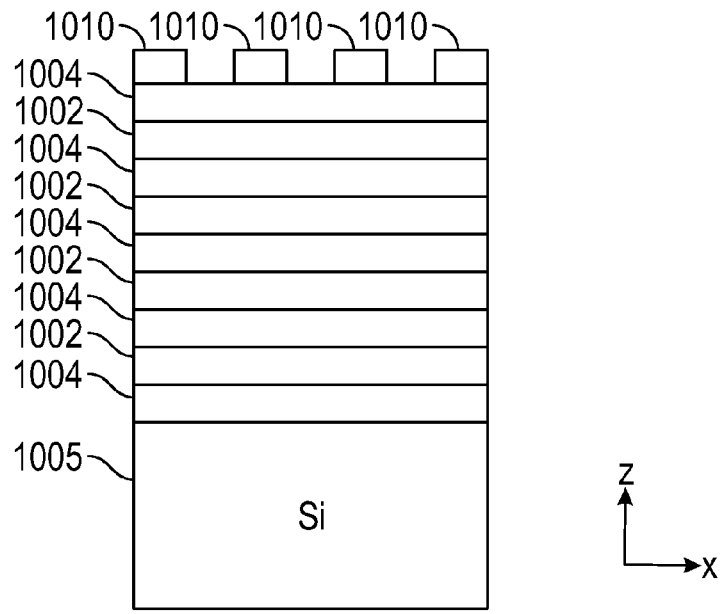
FIGS. 10A-B schematically illustrate another fabrication of horizontal silicon channels for an exemplary three-dimensional memory structure with Ferroelectric-gated Field Effect Transistors in accordance with embodiments the present disclosure.
Figure 10B:
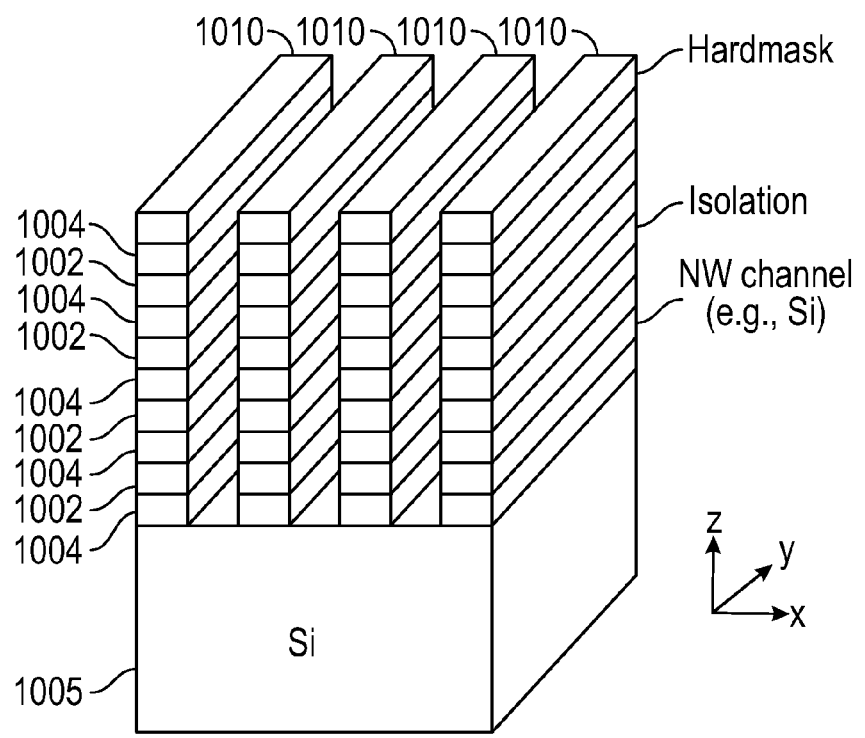

With reference to FIG. 10A-B, the process for fabricating the 3D Horizontal AND structure shown in FIG. 3-4 can provide for the deposition of the channel material 1002 on a semiconductor wafer 1005, for example, poly-silicon. The channel material 1002 and the isolation material 1004 (e.g., silicon dioxides) are deposited alternatively layer-by-layer as shown in FIG. 10A, to define each channel in the z dimension. Subsequent lithography in conjunction with a hardmask 1010 can define the x-y dimensions of the channels 1002 as shown in FIG. 10B.

For both fabrication process described with respect to FIGS. 9A-G and 10A-B, doping of the source/drain regions can be performed before defining the geometry of the channel structure. After the formation of the channel structure, a gate oxide (such as ferroelectric films or SONOS-like gate stacks) can be deposited by Atomic Layer Deposition (ALD) or other conformal deposition methods.

To form vertical lines, such as the gate lines in structure shown in FIGS. 3-4, the conducting material are first deposited in the defined region, then etched to form separate vertical lines. Alternatively, separate gate windows can be exposed first, followed by filling of the gate electrode material. FIG. 4A shows the cross sectional view of the gate contact portions.

For horizontal lines, such as the source/drain lines in FIG. 3, the electrode material and the isolation material are alternatively deposited in the defined region layer-by-layer, then etched to form patterns in the x-y plain. Alternatively, separate source/drain regions can be exposed first, followed by filling of the source/drain electrode material and the isolation material. The channel portions in the source/drain region can be removed before this deposition, or are not deposited at the first place when forming the channel structures, to avoid blocking filling of the source/drain contacts and the isolation material. As such, the source/drain contacts in FIG. 3 are actually not wrapping around the channel as the case in FIG. 1, but contacted at the interface between the channels and the source/drain lines, as shown in FIG. 4B. Alternatively, the source/drain electrodes can be formed before forming the channels, as the fabrication described in U.S. Publication No. 20070158736, the entirety of which is incorporated by reference herein. However, the channel material and the isolation material can be filled in the defined channel regions alternatively to form separate channels in the z-direction.

Figure 11:
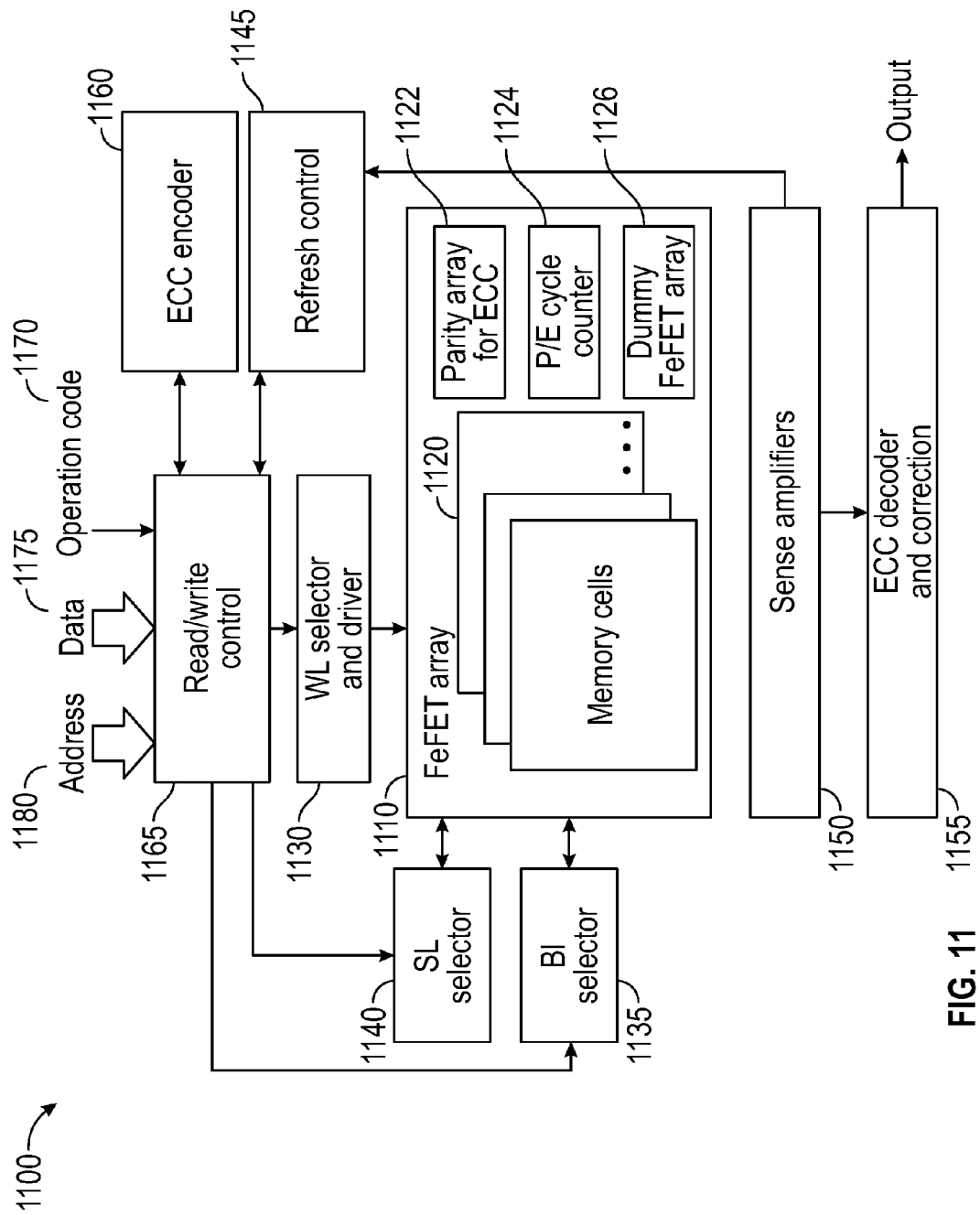
FIG. 11 is a block diagram of a Ferroelectric Field Effect Transistor (FeFET) memory circuit in accordance with exemplary embodiments of the present disclosure.

FIG. 11 is a block diagram of a non-volatile or RAM Ferroelectric Field Effect Transistor (FeFET) memory circuit 1100 (e.g., an integrated circuit) in accordance with exemplary embodiments of the present disclosure. The circuit 1100 can include one or more 3D Ferroelectric Field Effect Transistor (FeFET) memory array structures 1110 (e.g., 3D structures 100, 300), selector units (e.g., word line selector and driver 1130, bit line selector 1135, and source line selector 1140), refresh circuitry including, e.g., at least refresh control circuitry 1145, sense amplifiers 1150, Error Checking and Correcting (ECC) units (e.g., ECC decoder and correction circuitry 1155 and ECC encoder circuitry 1160), and general control circuitry (e.g., read/write control circuitry 1165). While an embodiment of the circuit 1100 has been illustrated as including an instance of refresh control circuitry 1145, ECC decoder and correction circuitry 1155, and ECC encoder circuitry 1160, those skilled in the art will recognize that exemplary embodiments of the present disclosure can include multiple instances of refresh control circuitry 1145, ECC decoder and correction circuitry 1155, and ECC encoder circuitry 1160, and that an operation and function of multiple instances of the circuitry can be overlapping and/or independent.

The architecture of FeFET-based memory arrays 1110 can vary based on the purpose of the memory and can be configured, for example, as non-volatile memory or RAM. For embodiments in which the FeFET-based memory arrays 1110 are implemented to operate as DRAM-like memory, such as the FeDRAM, the memory arrays 1110 include FeFET-based memory cells 1120 connected in an "AND" logic array configuration as described herein, as opposed to flash memory architectures that utilize "NAND" or "NOR" logic array. In addition to data storage provided by the memory cells 1120 of an array 1110, some, all, or none of the FeFET-based arrays 1110 and/or memory cells 1120 can be utilized for purposes other than data storage. For example, in exemplary embodiments, at least a portion of one or more of the FeFET arrays 1110 can include a parity storage area 1122 for ECC, storage area 1124 for counters, reference FeFET memory cell arrays 1126, and/or can include storage for any other suitable purpose, such as for hashing and the like. The ECC units (e.g., ECC decoder and correction circuitry 1155 and ECC encoder circuitry 1160) can be included in the circuit 1100 to enhance reliability of the circuit 1100. For FeDRAM, ECC, circuitry based on single error correction and double error detection (SEC/DED) can be utilized due to low area and power cost associated with these correction and detection schemes. In some embodiments the FeFETs of the FeFET-based memory arrays can be formed using $HfO_2$-based ferroelectrics.

In an exemplary write operation, the read/write control circuitry 1165 can receive an operation identifier 1170 (e.g., a write command), data 1175 to be written to one or more cells in the memory arrays 1110 according to the address 1180 associated with the data. In some embodiments, the read/write control circuitry 1165 can receive a logical address and can convert the logical address to a physical address corresponding to one or more memory cells 1120 in the array 1110. In some embodiments, the address 1180 received by the read/write control circuitry 1165 can be the physical address to which the data will be stored (e.g., a logical address can be converted to a physical address prior to receipt by the read/write control circuitry 1165).

In response to receipt of the write command, the data 1175 can be output from the read/write control circuitry 1165 to the ECC encoder circuitry 1160. The ECC encoder circuitry 1160 can generate parity code for the data 1175 and can associate the parity code with the address 1180 at which the data is to be stored in the memory array. Subsequently, the parity codes can be stored in the assigned area in FeFET-based memory arrays (e.g., the parity storage area 1122 for ECC) and the data 1175 can be stored in the memory cells of the array 1110. To store the data at the requested address 1180, the read/write control circuitry 1165 can control the word line selector and driver 1130, the bit line selector 1135, and the source selector 1140 to select one or more memory cells within the memory array 1100. The selected memory cell(s) of the memory array 1110 can correspond to the physical address at which the data is stored. In some embodiments, before, after, or during the write operation, a counter value can be incremented and stored in the storage area 1124 for the counters. This counter value can be used by the refresh control circuitry to determine when the memory cells 1120 of the array 1110 are refreshed (e.g., read and rewritten with the data that was read). In some embodiments, the voltages of memory cells in the dummy array 1126 can be affected by the write operation to change (e.g., disturb) the voltage associated the memory cells of the dummy array 1126, and the voltage of the memory cells in the dummy array 1126 can be used by the refresh control circuitry 1145 to determine when to refresh the data in the memory cells 1120 of the array 1110.

In an exemplary read operation, the read/write control circuitry 1165 can receive the operation identifier 1170 (e.g., a read command) and read one or more cells in the memory arrays 1110 according to an address 1180 associated with the data. In exemplary embodiments, the read/write control circuitry 1165 can receive a logical address and can convert the logical address to a physical address corresponding to one or more memory cells 1120 in the array 1110. In some embodiments, the address 1180 received by the read/write control circuitry 1165 can be the physical address to which the data will be stored (e.g., a logical address can be converted to a physical address prior to receipt by the read/write control circuitry 1165).

In response to receipt of the read command, the data stored at the requested address 1180 can be selected by the read/write control circuitry 1165 by controlling the word line selector and driver 1130, the bit line selector 1135, and the source selector 1140 to select one or more memory cells 1120 within the memory array 1110 at which the data is stored. During the read operation, a parity code corresponding to the requested data can be selected from the parity storage area 1122. The data at the selected memory cell(s) can be received by the sense amplifiers 1150, which can output the data and the parity code to the ECC decoder and correction circuitry 1155. The ECC detection and correction circuitry 1150 can process the data and the parity code to detect and correct errors in the data and the data read form the memory cells 1120 of the array 1110 can be output by the circuit 1100. In some embodiments, before, after, or during the read operation, the counter value can be incremented and stored in the storage area 1124 for the counters, which can be used by the refresh control circuitry to determine when the memory cells 1120 of the array 1110 are refreshed (e.g., read and rewritten with the data that was read). In some embodiments, the voltages of memory cells in the dummy array 1126 can be affected by the read operation to change (e.g., disturb) the voltage associated the memory cells of the dummy array 1126, and the voltage of the memory cells in the dummy array 1126 can be used by the refresh control circuitry 1145 to determine when to refresh the data in the memory cells 1120 of the array 1110.

While exemplary embodiments of the present disclosure have been described with respect to 3D FeFET-based memory arrays, exemplary embodiments of the present disclosure can be implemented for various logic circuits including AND, OR, NOR, and XOR structures and/or any other suitable logic circuits including adders and the like. In some embodiments, 3D FeFET devices described herein that are formed with vertical or horizontal channel structures can be incorporated into 3D integrated circuit structures with non-FeFET-based transistors.

While exemplary embodiments of a 3D memory structure 300 have been illustrated where the lengths of the gate electrode structures 324 can extend along the z-axis and the lengths of the source/drain electrodes 322 and 326 can extend along the x-axis such that the adjacent layers of source/drain electrodes 322 and 326 and the gate electrode structures 324 can be arranged substantially perpendicularly to each other, exemplary embodiments of the 3D memory structures of the present disclosure can have other geometries and/or arrangements. For example, rather than arranging adjacent layers of the source/drain electrodes and the gate electrodes substantially perpendicularly to each other, exemplary embodiments of the present disclosure can include alternating, substantially parallel layers of source/drain electrodes and gate electrodes that are offset by and angle that is less than or greater than ninety degrees (e.g., approximately forty-five degrees, approximately sixty degrees, approximately one hundred thirty-five degrees, and/or any other suitable angles). Likewise, while exemplary embodiments of a 3D memory structure 300 have been illustrated where the channel structures are substantially perpendicular to the source/drain electrodes and the gate electrodes, exemplary embodiments of the 3D memory structures of the present disclosure can have other geometries and/or arrangements. For example, rather than arranging the channel structures substantially perpendicularly to the source/drain electrodes and/or the gate electrodes, exemplary embodiments of the present disclosure can include 3D memory structures where the channel structures are not substantially perpendicular to the source/drain electrodes and/or gate electrodes (e.g., approximately forty-five degrees, approximately sixty degrees, approximately one hundred five degrees, approximately one hundred thirty-five degrees, and/or any other suitable angles).

The foregoing description of the specific embodiments of the subject matter disclosed herein has been presented for purposes of illustration and description and is not intended to limit the scope of the subject matter set forth herein. It is fully contemplated that other various embodiments, modifications and applications will become apparent to those of ordinary skill in the art from the foregoing description and accompanying drawings. Thus, such other embodiments, modifications, and applications are intended to fall within the scope of the following appended claims. Further, those of ordinary skill in the art will appreciate that the embodiments, modifications, and applications that have been described herein are in the context of particular environment, and the subject matter set forth herein is not limited thereto, but can be beneficially applied in any number of other manners, environments and purposes. Accordingly, the claims set forth below should be construed in view of the full breadth and spirit of the novel features and techniques as disclosed herein.

What is claimed is:

1. A three-dimensional Ferroelectric Field Effect Transistor (FeFET)-based memory array comprising:
    a semiconductor substrate;
    an array of channel structures having a ferroelectric material disposed along the channel structures;
    an array of gate electrode structures operatively coupled to the channel structures at discrete regions along a length of the channel structures; and
    an array of source/drain electrode structures operatively coupled to the channels structures at discrete regions along a length of the channel structures,
    wherein channel structures, the gate electrode structures, and the source/drain electrodes structures are substantially perpendicularly disposed with respect to each other on the semiconductor substrate, and
    wherein an array of FeFETs memory cells are formed on each of the channel structures based on the discrete regions of the channel structure at which the gate electrode structures and the source/drain electrode structures are operatively coupled.

2. The memory array of claim 1, wherein a length of the channel structures extend vertically with respect to the semiconductor substrate to form vertical columns.

3. The memory array of claim 2, wherein a length of the gate electrode structures and the source/drain electrode structures extend horizontally with respect to the substrate to form horizontal rows.

4. The memory array of claim 2, wherein the gate electrode structures and the source/drain electrode structures are vertically and alternatingly stacked to form layers.

5. The memory array of claim 4, further comprising:
an isolating material disposed between adjacent layers of gate electrode structures and source/drain electrode structures.

6. The memory array of claim 1, wherein a length of the channel structures extend horizontally with respect to the semiconductor substrate to form rows of channel structures in a vertically arranged stack.

7. The memory array of claim 6, wherein a length of the gate electrode structures extend vertically with respect to the substrate to form vertical columns.

8. The memory array of claim 7, wherein a length of the source/drain electrode structures extend horizontally with respect to the substrate to form horizontal rows.

9. The memory array of claim 8, wherein the gate electrode structures and the source/drain electrode structures are alternatingly disposed along a length of the channel structures.

10. The memory array of claim 1, further comprising:
an interfacial material disposed on along the channel structures, the interfacial material being disposed between the channel structures and the ferroelectric material.

11. The memory array of claim 1, wherein the gate electrode structures and the source/drain electrode structures are arranged with logical AND connections.

12. A Ferroelectric Field Effect Transistor (FeFET)-based memory circuit comprising:
a plurality of FeFET-based data memory cells with logical AND connections, the FeFET-based data memory cells being arranged in a three-dimensional structure including:
an array of channel structures having a ferroelectric material disposed along the channel structures;
an array of gate electrode structures operatively coupled to the channel structures at discrete regions along a length of the channel structures; and
an array of source/drain electrode structures operatively coupled to the channels structures at discrete regions along a length of the channel structures,
wherein channel structures, the gate electrode structures, and the source/drain electrodes structures are substantially perpendicularly disposed with respect to each other on a semiconductor substrate, and
wherein the plurality of FeFETs memory cells are formed by each of the channel structures based on the discrete regions of the channel structure at which the gate electrode structures and the source/drain electrode structures are operatively coupled.

13. A method of fabricating a three-dimensional Ferroelectric Field Effect Transistor (FeFET)-based memory array, the method comprising:
a. forming an array of hardmask on a semiconductor wafer;
b. etching isotropically one line of the hardmask to form etched walls;
c. covering sides of the etched walls with a mask;
d. repeating steps b and c to obtaining a multi-layer structure; and
e. further etching or oxidizing the multi-layer structure to separate channels in a direction that is substantially perpendicular to the semiconductor wafer to form a plurality of channel structures.

14. The method of claim 13, further comprising:
forming gate electrode structures by depositing conducting material in defined regions corresponding at which the gate electrode structures are to be formed and etching the conducting material.

15. The method of claim 13, further comprising:
exposing separate gate windows in the multilayer structure; and
filling the separate gate windows with gate electrode material to form a plurality of gate electrode structures.

16. The method of claim 13, further comprising:
etching the multilayer structure to form patterns in a plane that is substantially parallel to the semiconductor wafer.

17. The method of claim 13, further comprising:
exposing separate source/drain regions; and
filling the source/drain regions with source/drain electrode material and isolation material.

18. A method of fabricating a three-dimensional Ferroelectric Field Effect Transistor (FeFET)-based memory array, the method comprising:
a. depositing channel material on a semiconductor wafer;
b. depositing isolation material on the channel material;
c. repeating steps a and b to form a multilayer structure having alternating layers of the channel material and the isolation material;
d. forming a hardmask on the multilayer structure to cover portions of the multilayer structure;
e. removing strips of the multilayer structure to define separate channel structures that extend horizontally with respect to the semiconductor wafer
f. exposing separate gate windows in the multilayer structure; and
g. filling the separate gate windows with gate electrode material to form a plurality of gate electrode structures.

19. The method of claim 18, further comprising:
forming gate electrode structures by depositing conducting material in defined regions corresponding at which the gate electrode structures are to be formed and etching the conducting material.

20. The method of claim 18, further comprising:
etching the multilayer structure to form patterns in a plane that is substantially parallel to the semiconductor wafer.

21. The method of claim 18, further comprising:
exposing separate source/drain regions; and
filling the source/drain regions with source/drain electrode material and isolation material.

22. A method of fabricating a three-dimensional Ferroelectric Field Effect Transistor (FeFET)-based memory array, the method comprising:
a. depositing channel material on a semiconductor wafer;
b. depositing isolation material on the channel material;
c. repeating steps a and b to form a multilayer structure having alternating layers of the channel material and the isolation material;
d. forming a hardmask on the multilayer structure to cover portions of the multilayer structure;

e. removing strips of the multilayer structure to define separate channel structures that extend horizontally with respect to the semiconductor wafer;
f. exposing separate source/drain regions; and
g. filling the source/drain regions with source/drain electrode material and isolation material.

23. The method of claim 22, further comprising:
forming gate electrode structures by depositing conducting material in defined regions corresponding at which the gate electrode structures are to be formed and etching the conducting material.

24. The method of claim 22, further comprising:
etching the multilayer structure to form patterns in a plane that is substantially parallel to the semiconductor wafer.

* * * * *